(12) United States Patent
Lhee et al.

(10) Patent No.: US 12,317,708 B2
(45) Date of Patent: *May 27, 2025

(54) DISPLAY APPARATUS

(71) Applicant: SAMSUNG DISPLAY CO., LTD., Yongin-si (KR)

(72) Inventors: Zail Lhee, Yongin-si (KR); Keunsoo Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/411,837

(22) Filed: Jan. 12, 2024

(65) Prior Publication Data

US 2024/0155895 A1 May 9, 2024

Related U.S. Application Data

(63) Continuation of application No. 17/731,814, filed on Apr. 28, 2022, now Pat. No. 11,925,083, which is a
(Continued)

(30) Foreign Application Priority Data

Jan. 25, 2018 (KR) .................. 10-2018-0009605

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 59/88* (2023.02)

(58) Field of Classification Search
CPC ............. H10K 59/131; H10K 50/844; H10K 59/8731; H10K 59/124; H10K 59/1213;
(Continued)

(56) References Cited

U.S. PATENT DOCUMENTS 6,307,613 B1 10/2001 Iida
7,675,233 B2 3/2010 Lee
(Continued)

FOREIGN PATENT DOCUMENTS

CN 102916032 2/2013
CN 105679797 6/2016
(Continued)

OTHER PUBLICATIONS

Office Action dated Mar. 10, 2023 in corresponding U.S. Appl. No. 17/731,814.
(Continued)

*Primary Examiner* — Sonya McCall-Shepard
(74) *Attorney, Agent, or Firm* — F. CHAU & ASSOCIATES, LLC

(57) ABSTRACT

A display apparatus includes a substrate, a display unit disposed on the substrate, an insulating layer disposed on the substrate, a power supply wire disposed on the insulating layer outside the display unit, and a cladding layer. The display unit includes a pixel circuit and a display element electrically connected to the pixel circuit. The insulating layer extends from the display unit to an edge of the substrate. The power supply wire is electrically connected to the display element and includes an alignment pattern that exposes at least a portion of the insulating layer. The cladding layer covers an inner surface of the alignment pattern and contacts the at least a portion of the insulating layer.

19 Claims, 14 Drawing Sheets

Related U.S. Application Data continuation of application No. 16/934,127, filed on Jul. 21, 2020, now Pat. No. 11,335,761, which is a continuation of application No. 16/205,753, filed on Nov. 30, 2018, now Pat. No. 10,720,486.

(51) Int. Cl.
  *H10K 59/121* (2023.01)
  *H10K 59/123* (2023.01)
  *H10K 59/124* (2023.01)
  *H10K 59/80* (2023.01)
  *H10K 59/88* (2023.01)
  *H10K 71/10* (2023.01)

(58) Field of Classification Search
  CPC .. H10K 59/123; H10K 59/805; H01L 27/124; H01L 27/1248
  See application file for complete search history.

(56) References Cited

U.S. PATENT DOCUMENTS

| | | | |
|---|---|---|---|
| 8,432,334 | B2 | 4/2013 | Bang et al. |
| 8,558,977 | B2 | 10/2013 | Gettemy et al. |
| 9,368,745 | B2 | 6/2016 | Lee et al. |
| 9,600,111 | B2 | 3/2017 | Hong et al. |
| 9,685,626 | B2 | 6/2017 | Kim |
| 9,941,338 | B2 | 4/2018 | Seo et al. |
| 10,720,486 | B2 | 7/2020 | Lhee et al. |
| 11,335,761 | B2 | 5/2022 | Lhee et al. |
| 2009/0058280 | A1 | 3/2009 | Jo et al. |
| 2010/0259467 | A1 | 10/2010 | Su et al. |
| 2013/0032804 | A1 | 2/2013 | Kim et al. |
| 2015/0380474 | A1 | 12/2015 | Lee et al. |
| 2016/0218151 | A1 | 7/2016 | Kwon et al. |
| 2017/0262109 | A1 | 9/2017 | Choi et al. |
| 2017/0264807 | A1 | 9/2017 | Bonden et al. |
| 2019/0229175 | A1 | 7/2019 | Lhee et al. |
| 2020/0350393 | A1 | 11/2020 | Lhee et al. |
| 2022/0254862 | A1 | 8/2022 | Lhee et al. |

FOREIGN PATENT DOCUMENTS

| | | |
|---|---|---|
| CN | 105824457 | 8/2016 |
| EP | 2287914 | 2/2011 |
| JP | 2000-147485 A2 | 5/2000 |
| KR | 10-2011-0019498 A | 2/2011 |
| KR | 10-2014-0065284 A | 5/2014 |
| KR | 10-2015-0108479 A | 9/2015 |
| KR | 10-2016-0000980 A | 1/2016 |
| KR | 10-2016-0090456 A | 8/2016 |
| KR | 10-2016-0091771 A | 8/2016 |
| KR | 10-2016-0116240 A | 10/2016 |
| KR | 10-2017-0071098 A | 6/2017 |
| KR | 10-2017-0106621 A | 9/2017 |

OTHER PUBLICATIONS

Final Office Action dated Jun. 29, 2023 in corresponding U.S. Appl. No. 17/731,814.

Office Action dated Sep. 13, 2023 in corresponding U.S. Appl. No. 16/934,127.

Office Action dated Nov. 22, 2019 in corresponding U.S. Appl. No. 16/205,753.

DISPLAY APPARATUS

CROSS-REFERENCE TO RELATED APPLICATIONS

This application is a continuation application of U.S. patent application Ser. No. 17/731,814 filed Apr. 28, 2022, which is a continuation of U.S. patent application Ser. No. 16/934,127 filed Jul. 21, 2020, issued as U.S. Pat. No. 11,335,761 on May 17, 2022, which is a continuation application of U.S. patent application Ser. No. 16/205,753 filed Nov. 30, 2018, issued as U.S. Pat. No. 10,720,486 on Jul. 21, 2020, which claims priority under 35 U.S.C. § 119 to Korean Patent Application No. 10-2018-0009605, filed on Jan. 25, 2018, the disclosures of which are incorporated by reference herein in their entirety.

TECHNICAL FIELD

Exemplary embodiments of the present disclosure relate to a display apparatus, and more particularly, to a display apparatus having a reduced non-display area.

DISCUSSION OF THE RELATED ART

An organic light-emitting diode (OLED) display apparatus is a self-emissive type of display apparatus that does not require a separate light source. As a result, OLED display apparatuses may be manufactured to be thin and lightweight, and may be driven at a low voltage. These benefits, as well as the high quality display characteristics offered by OLED display apparatuses such as a wide viewing angle, high contrast, and a fast response time, have resulted in an increase in the use of OLED display apparatuses as next generation display apparatuses.

SUMMARY

Exemplary embodiments of the present disclosure include a display apparatus having a reduced non-display area.

According to an exemplary embodiment of the present disclosure, a display apparatus includes a substrate, a display unit disposed on the substrate, an insulating layer disposed on the substrate, a power supply wire disposed on the insulating layer outside the display unit, and a cladding layer. The display unit includes a pixel circuit and a display element electrically connected to the pixel circuit. The insulating layer extends from the display unit to an edge of the substrate. The power supply wire is electrically connected to the display element and includes an alignment pattern that exposes at least a portion of the insulating layer. The cladding layer covers an inner surface of the alignment pattern and contacts the at least a portion of the insulating layer.

In an exemplary embodiment, the display element includes a pixel electrode, an intermediate layer disposed on the pixel electrode, and a common electrode facing the pixel electrode. The power supply wire is electrically connected to the common electrode of the display element, and the intermediate layer is disposed between the pixel electrode and the common electrode.

In an exemplary embodiment, the alignment pattern includes a first alignment pattern, and a second alignment pattern spaced apart from the first alignment pattern. The second alignment pattern is disposed over an edge of the power supply wire.

In an exemplary embodiment, the display apparatus further includes a first dam portion disposed on the power supply wire, and a second dam portion disposed on the power supply wire. The first and second dam portions are spaced apart from each other, the first dam portion is disposed on the first alignment pattern, and the second dam portion is disposed on the second alignment pattern.

In an exemplary embodiment, the second dam portion covers the second alignment pattern and covers one end portion of the power supply wire.

In an exemplary embodiment, the pixel circuit includes a thin film transistor including a semiconductor layer, a gate electrode, a source electrode, and a drain electrode. The power supply wire includes a same material as the source electrode or the drain electrode.

In an exemplary embodiment, the display apparatus further includes an auxiliary pattern layer disposed under the power supply wire and overlapping the alignment pattern.

In an exemplary embodiment, the insulating layer includes a first lower insulating layer and a second lower insulating layer disposed on the first lower insulating layer. The power supply wire is disposed on the second lower insulating layer, and the auxiliary pattern layer is disposed on the first lower insulating layer.

In an exemplary embodiment, the auxiliary pattern layer includes a same material as the gate electrode.

In an exemplary embodiment, the display apparatus further includes an upper insulating layer disposed on the power supply wire, and an auxiliary wire disposed on the upper insulating layer. The upper insulating layer includes a contact hole exposing at least a portion of the power supply wire, and the auxiliary wire is electrically connected to the power supply wire via the contact hole.

In an exemplary embodiment, the display apparatus further includes a dam portion disposed on the auxiliary wire. The dam portion overlaps the alignment pattern.

In an exemplary embodiment, the cladding layer includes a same material as the upper insulating layer.

In an exemplary embodiment, the display apparatus further includes an encapsulation portion including a first inorganic film, a second inorganic film, and an organic film disposed between the first inorganic film and the second inorganic film. The encapsulation portion covers the display unit, covers an end of the insulating layer, and extends toward the edge of the substrate.

In an exemplary embodiment, the display apparatus further includes an auxiliary dam portion covering the end of the insulating layer. The encapsulation portion covers the auxiliary dam portion.

According to an exemplary embodiment of the present disclosure, a display apparatus includes a substrate, a display unit disposed on the substrate, an insulating layer disposed on the substrate, and a power supply wire disposed on the insulating layer outside the display unit. The display unit includes a pixel circuit and a display element electrically connected to the pixel circuit. The insulating layer extends from the display unit to an edge of the substrate. The power supply wire is electrically connected to the display element, and includes a first alignment pattern and a second alignment pattern that expose at least a portion of the insulating layer. The first alignment pattern and the second alignment pattern are spaced apart from each other, and the second alignment pattern is open at one side toward an edge of the substrate.

In an exemplary embodiment, the second alignment pattern is disposed over an edge of the power supply wire.

In an exemplary embodiment, the display apparatus further includes a first dam portion disposed on the power supply wire, and a second dam portion disposed on the power supply wire and spaced apart from the first dam portion. The first dam portion is disposed on the first alignment pattern, and the second dam portion is disposed on the second alignment pattern.

In an exemplary embodiment, the second dam portion covers the second alignment pattern and covers one edge of the power supply wire.

In an exemplary embodiment, the display apparatus further includes an upper insulating layer disposed on the power supply wire, and an auxiliary wire disposed on the upper insulating layer. The upper insulating layer includes a contact hole exposing at least a portion of the power supply wire, and the auxiliary wire is electrically connected to the power supply wire via the contact hole.

In an exemplary embodiment, the first dam portion is disposed on the auxiliary wire.

According to an exemplary embodiment of the present disclosure, a display apparatus includes a substrate having a display area, a wiring area disposed outside the display area, and an edge area disposed outside the wiring area. The display apparatus further includes an insulating layer disposed in the display area, a display unit, a power supply wire disposed on the insulating layer, and an alignment pattern disposed in the wiring area. The insulating layer extends from the wiring area to the edge area. The display unit includes a pixel circuit disposed in the display area of the substrate and a display element electrically connected to the pixel circuit. The power supply wire is electrically connected to a common electrode of the display element.

In an exemplary embodiment, the pixel circuit includes a thin film transistor including a semiconductor layer and a gate electrode partially overlapping the semiconductor layer, a data line, and a driving voltage line disposed on the data line. The alignment pattern includes a same material as the semiconductor layer, the gate electrode, or the data line.

In an exemplary embodiment, the display apparatus further includes an auxiliary wire disposed on the power supply wire and electrically contacting the power supply wire. The power supply wire includes a same material as the data line, and the auxiliary wire comprises a same material as the driving voltage line.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
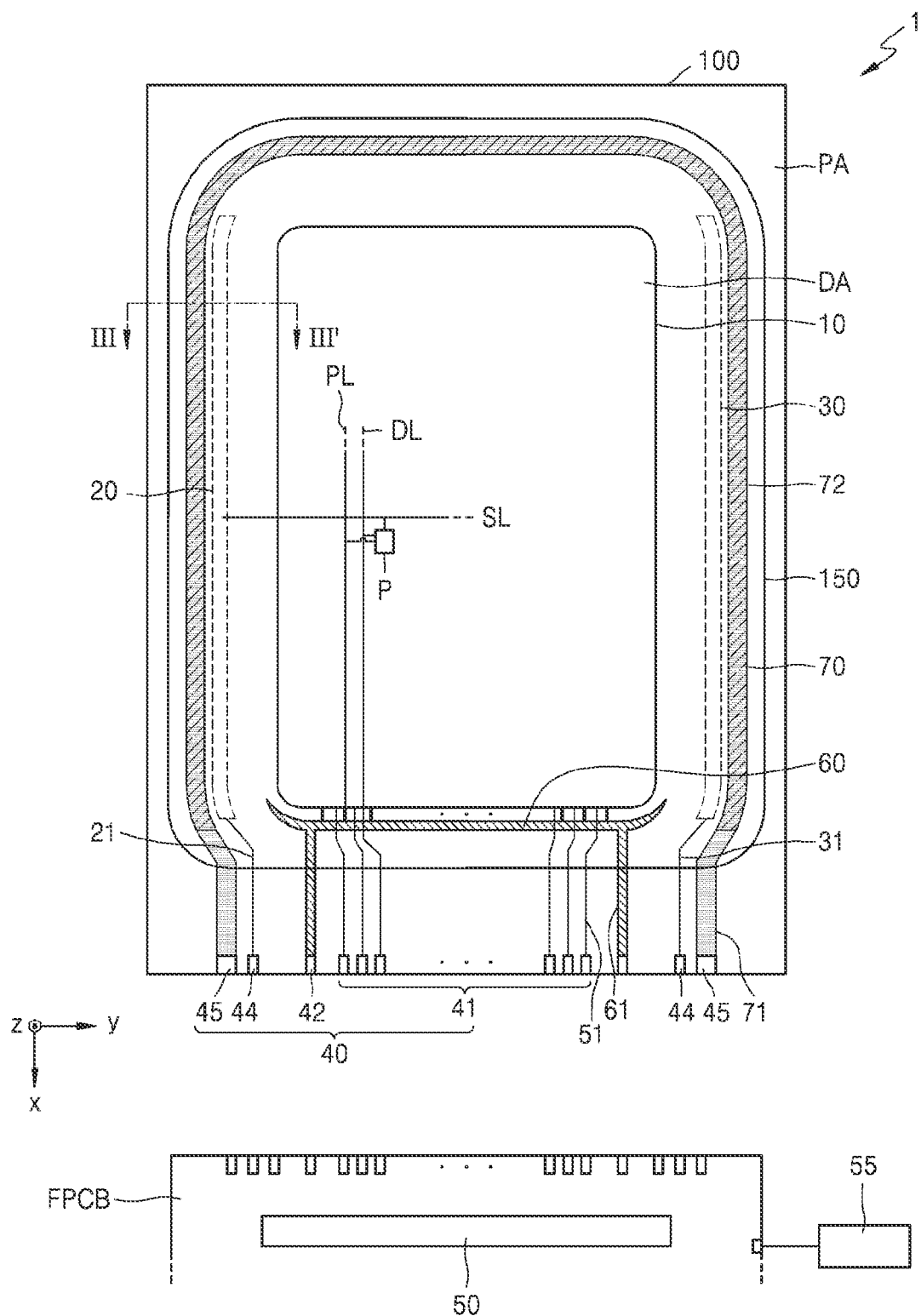
FIG. 1 is a schematic plan view of a display apparatus according to an exemplary embodiment of the present disclosure.

Exemplary embodiments of the present disclosure will be described more fully hereinafter with reference to the accompanying drawings. Like reference numerals may refer to like elements throughout the accompanying drawings.

It will be understood that although the terms "first", "second", etc. may be used herein to describe various elements, these elements should not be limited by these terms. These elements are only used to distinguish one element from another. As used herein, the singular forms "a", "an", and "the" are intended to include the plural forms as well, unless the context clearly indicates otherwise.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a certain process order may be different from the described order. For example, two consecutively described processes may be performed substantially at the same time or performed in an order opposite to the described order.

A display apparatus is an apparatus for displaying an image, and may be, for example, a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode ray display apparatus, etc.

Hereinafter, an organic light-emitting display apparatus will be described as an example of a display apparatus according to exemplary embodiments of the present disclosure. However, the display apparatus of the present disclosure is not limited thereto, and may be various types of display apparatuses.

Figure 2:
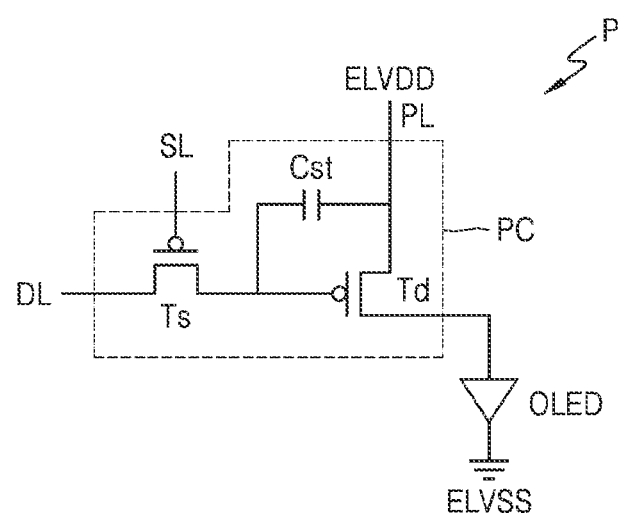
FIG. 2 is an equivalent circuit diagram of one pixel of a display apparatus according to an exemplary embodiment of the present disclosure.

FIG. 1 is a schematic plan view of a display apparatus 1 according to an exemplary embodiment of the present disclosure. FIG. 2 is an equivalent circuit diagram of one pixel P of the display apparatus 1 according to an exemplary embodiment of the present disclosure.

Referring to FIG. 1, in an exemplary embodiment, the display apparatus 1 includes a display unit 10 disposed on a substrate 100. The display unit 10 includes pixels P connected to scan lines SL extending in a first direction (e.g., a y-direction) and data lines DL extending in a second direction (e.g., an x-direction) crossing the first direction. The display unit 10 includes a display area DA, and displays an image in the display area DA using light emitted by the pixels P.

Each pixel P may emit, for example, red light, green light, blue light, or white light. Each pixel P includes a display element. The display element may include, for example, an organic light-emitting diode. A pixel P described herein refers to a pixel that emits light of one of red, green, blue, and white colors as described above.

Referring to FIG. 2, in an exemplary embodiment, the pixel P includes a pixel circuit PC connected to a scan line SL and a data line DL, and an organic light-emitting diode OLED connected to the pixel circuit PC. The pixel circuit PC includes a driving thin film transistor Td, a switching thin film transistor Ts, and a storage capacitor Cst. The switching thin film transistor Ts is connected to the scan line SL and the data line DL, and transmits a data signal input via the data line DL to the driving thin film transistor Td according to a scan signal input via the scan line SL.

The storage capacitor Cst is connected to the switching thin film transistor Ts and a driving voltage line PL, and stores a voltage corresponding to a voltage received from the switching thin film transistor Ts and a driving power supply voltage ELVDD supplied to the driving voltage line PL.

The driving thin film transistor Td is connected to the driving voltage line PL and the storage capacitor Cst, and may control a driving current flowing through the organic light-emitting diode OLED from the driving voltage line PL in response to a voltage value stored in the storage capacitor Cst. Due to the driving current, the organic light-emitting diode OLED may emit light having a certain brightness. The organic light-emitting diode OLED may emit, for example, red light, green light, blue light, or white light.

Although a case in which the pixel P includes two thin film transistors and one storage thin film transistor has been described with reference to FIG. 2, exemplary embodiments of the present disclosure are not limited thereto. For example, in exemplary embodiments, the pixel circuit PC of the pixel P may be variously modified, for example, to include three or more thin film transistors or to include two or more storage thin film transistors.

Referring again to FIG. 1, a peripheral area PA is disposed outside of the display area DA. For example, the peripheral area PA may surround the display area DA. The peripheral area PA, which is an area in which the pixels P are not arranged, corresponds to a non-display area in which an image is not displayed.

In an exemplary embodiment, a drive circuit (e.g., first and second scan drive circuits 20 and 30), a terminal portion 40, a driving power supply wire 60, and a common power supply wire 70, are arranged in the peripheral area PA.

The first and second scan drive circuits 20 and 30 are arranged in the peripheral area PA of the substrate 100, and generate and transmit a scan signal to each pixel P via the scan lines SL. Although FIG. 1 illustrates an exemplary embodiment in which the first scan drive circuit 20 is on the left side of the display unit 10 and the second scan drive circuit 30 is on the right side of the display unit 10, exemplary embodiments of the present disclosure are not limited thereto. For example, in exemplary embodiments, only one scan drive circuit is included in the display apparatus 1.

The terminal portion 40 is disposed on one end portion of the substrate 100, and includes a plurality of terminals 41, 42, 44, and 45. In an exemplary embodiment, the terminal portion 40 is not covered by an insulating layer and is exposed. As a result, the terminal portion 40 may be electrically connected to a flexible printed circuit board FPCB. The terminal portion 40 may be disposed on one side of the substrate 100, for example, in an area in which the first and second scan drive circuits 20 and 30 are not disposed.

The flexible printed circuit board FPCB electrically connects a controller 55 and the terminal portion 40 to each other, and a signal or power is transmitted from the controller 55 to the terminal portion 40 via connection wires 21, 31, 51, 61, and 71 connected to the terminal portion 40.

The controller 55 may receive, for example, a vertical synchronization signal, a horizontal synchronization signal, and a clock signal, and may generate a control signal for controlling driving of the first and second scan drive circuits 20 and 30. The generated signal may be transmitted to each of the first and second scan drive circuits 20 and 30 via the terminal 44 connected to the flexible printed circuit board FPCB and the connection wires 21 and 31. A scan signal of the first and second scan drive circuits 20 and 30 may be provided to each pixel P via the scan lines SL. In addition, the controller 55 provides the driving power supply voltage ELVDD and a common power supply voltage ELVSS to the driving power supply wire 60 and the common power supply wire 70, respectively, via the terminals 42 and 45 connected to the flexible printed circuit board FPCB and the connection wires 61 and 71. The driving power supply voltage ELVDD may be provided to each pixel P via the driving voltage line PL, and the common power supply voltage ELVSS may be provided to a common electrode of the pixel P.

In an exemplary embodiment, a data drive circuit 50 is disposed on the flexible printed circuit board FPCB. The data drive circuit 50 provides a data signal to each pixel P. The data signal of the data drive circuit 50 is provided to each pixel P via the connection wire 51 connected to the terminal 41 and the data line DL connected to the connection wire 51. Although FIG. 1 illustrates an exemplary embodiment in which the data drive circuit 50 is disposed on the flexible printed circuit board FPCB, exemplary embodiments of the present disclosure are not limited thereto. For example, in exemplary embodiments, the data drive circuit 50 may be disposed in the peripheral area PA of the substrate 100.

In an exemplary embodiment, the driving power supply wire 60 is disposed in the peripheral area PA. For example, the driving power supply wire 60 may be disposed between one side of the display unit 10 adjacent to the terminal portion 40 and the terminal portion 40. The driving power supply voltage ELVDD provided via the connection wire 61 connected to the terminal 41 may be provided to each pixel P via the driving voltage line PL.

In an exemplary embodiment, the common power supply wire 70 is disposed in the peripheral area PA and partially surrounds the display unit 10. For example, the common power supply wire 70 may be in the form of a loop in which one side of the display unit 10 adjacent to the terminal portion 40 is open, and may extend along edges of the substrate 100 except for the terminal portion 40.

The common power supply wire 70 is electrically connected to the connection wire 71 connected to the terminal 45, and provides the common power supply voltage ELVSS to a common electrode (e.g. a cathode) of an organic light-emitting diode of the pixel P. The connection wire 71 of FIG. 1 is in the form of a loop having one side open, which partially surrounds the display unit 10, and overlaps the common power supply wire 70. The connection wire 71 partially surrounds the display unit 10 in a similar manner as the common power supply wire 70, but may extend longer than the common power supply wire 70 toward an end portion of the substrate 100, for example, the terminal portion 40.

Figure 3:
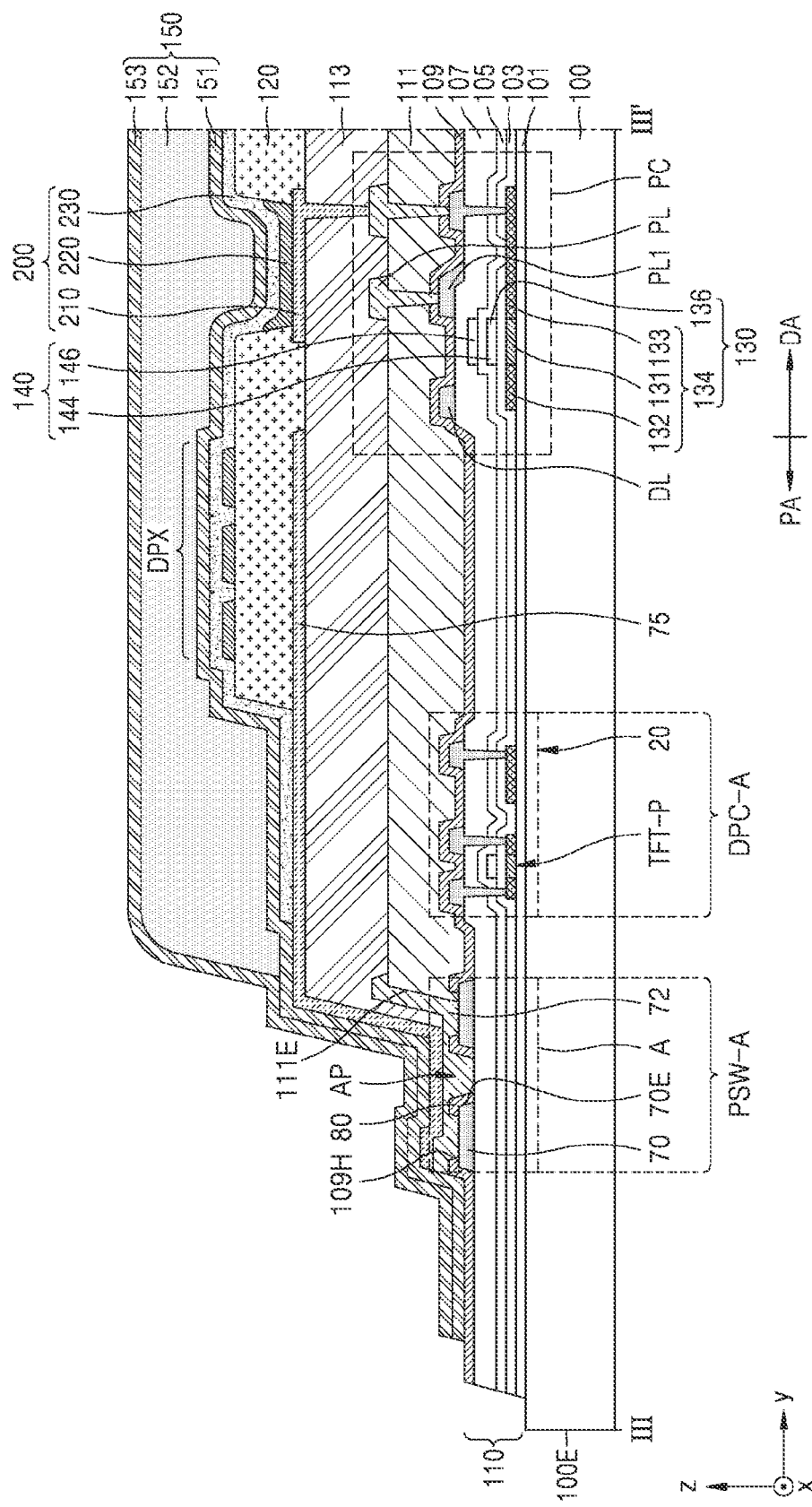
FIG. 3 is a schematic cross-sectional view of a display apparatus according to an exemplary embodiment of the present disclosure.

In an exemplary embodiment, an encapsulation portion 150 entirely covers the display area DA, and extends toward the peripheral area PA and covers a portion of the peripheral area PA. The encapsulation portion 150 may extend to the outside of the common power supply wire 70. Referring to FIG. 3, in an exemplary embodiment, the encapsulation portion 150 includes a first inorganic film 151, a second inorganic film 153, and an organic film 152 disposed therebetween. In this case, in an exemplary embodiment, the first inorganic film 151 and the second inorganic film 153 included in the encapsulation portion 150 extend to the outside of the common power supply wire 70, and the organic film 152 does not extend to the outside of the common power supply wire 70.

FIG. 3 is a schematic cross-sectional view of a display apparatus according to an exemplary embodiment of the present disclosure. FIG. 3 is a cross-sectional view taken along line III-III' of FIG. 1.

Referring to FIG. 3, in an exemplary embodiment, the display apparatus includes the display area DA and the peripheral area PA. Thus, the substrate 100 includes an area corresponding to the display area DA and an area corresponding to the peripheral area PA. The substrate 100 may include various materials such as, for example, glass, metal, or plastic such as polyethylene terephthalate (PET), polyethylene naphthalate (PEN), or polyimide.

Referring to the display area DA of FIG. 3, in an exemplary embodiment, a buffer layer 101 is disposed on the substrate 100. The buffer layer 101 may prevent a foreign material or moisture from permeating through the substrate 100. The buffer layer 101 may include an inorganic material such as, for example, silicon oxide (SiOx), silicon nitride (SiNx) and/or silicon oxynitride (SiON), and may be a single layer or a multilayer.

In an exemplary embodiment, a thin film transistor 130 and a storage capacitor 140 disposed at a location corresponding to the display area DA, and an organic light-emitting device, which is a display element 200 electrically connected thereto, are disposed on the substrate 100. The thin film transistor 130 of FIG. 3 may correspond to one of the thin film transistors included in the pixel circuit PC described with reference to FIG. 2, for example, the driving thin film transistor Td, and the storage capacitor 140 of FIG. 3 may correspond to the storage capacitor Cst described with reference to FIG. 2.

The thin film transistor 130 includes a semiconductor layer 134 and a gate electrode 136. The semiconductor layer 134 may include, for example, polysilicon. The semiconductor layer 134 includes a channel region 131 overlapping the gate electrode 136, and a source region 132 and a drain region 133 respectively disposed on sides of the channel region 131. The source region 132 and the drain region 133 include impurities having a higher concentration than those of the channel region 131. In this regard, the impurities may include, for example, N-type impurities or P-type impurities. The source region 132 and the drain region 133 correspond to a source electrode and a drain electrode of the thin film transistor 130.

Although a case in which the semiconductor layer 134 includes polysilicon has been described herein, exemplary embodiments of the present disclosure are not limited thereto. For example, in exemplary embodiments, the semiconductor layer 134 may include amorphous silicon or may include an organic semiconductor material.

In an exemplary embodiment, a gate insulating layer 103 is disposed between the semiconductor layer 134 and the gate electrode 136. The gate insulating layer 103 may be an inorganic insulating layer such as, for example, silicon oxynitride (SiON), silicon oxide (SiOx) and/or silicon nitride (SiNx), and the inorganic insulating layer may be, for example, a single layer or a multilayer.

The storage capacitor 140 includes first and second storage capacitor plates 144 and 146 overlapping each other. A first interlayer insulating layer 105 may be disposed between the first and second storage capacitor plates 144 and 146. The first interlayer insulating layer 105, which is a layer having a certain dielectric constant, may be an inorganic insulating layer such as, for example, silicon oxynitride (SiON), silicon oxide (SiOx) and/or silicon nitride (SiNx), and may be a single layer or a multilayer. Although FIG. 3 illustrates the storage capacitor 140 overlapping the thin film transistor 130, and the first storage capacitor plate 144 being the gate electrode 136 of the thin film transistor 130, exemplary embodiments of the present disclosure are not limited thereto. For example, in exemplary embodiments, the storage capacitor 140 does not overlap the thin film transistor 130, and the first storage capacitor plate 144 is an independent element separate from the gate electrode 136 of the thin film transistor 130.

In an exemplary embodiment, the storage capacitor 140 is covered by a second interlayer insulating layer 107. The second interlayer insulating layer 107 may be an inorganic insulating layer such as, for example, silicon oxynitride (SiON), silicon oxide (SiOx) and/or silicon nitride (SiNx), and may be a single layer or a multilayer.

In an exemplary embodiment, the driving voltage line PL is disposed on a first organic insulating layer 111. The driving voltage line PL may include, for example, aluminum (Al), copper (Cu), titanium (Ti), etc., and may be a multilayer or a single layer. In an exemplary embodiment, the driving voltage line PL may have a multilayer structure of Ti/Al/Ti.

In the exemplary embodiment of FIG. 3, a lower driving voltage line PL1 is further included. The lower driving voltage line PL1 is disposed under the first organic insulating layer 111. The lower driving voltage line PL1 may be electrically connected to the driving voltage line PL via a contact hole penetrating the first organic insulating layer 111, and thus, may prevent a voltage drop of the driving voltage ELVDD provided via the driving voltage line PL. The lower driving voltage line PL1 may include the same material as that of the data line DL. For example, the lower driving voltage line PL1 and the data line DL may include aluminum (Al), copper (Cu), titanium (Ti), etc., and may be a multilayer or a single layer. In an exemplary embodiment, the lower driving voltage line PL1 and the data line DL may have a multilayer structure such as Ti/Al/Ti or TiN/Al/Ti.

The first organic insulating layer 111 may include an organic insulation material. The organic insulation material may include, for example, an imide-based polymer, a general-purpose polymer such as poly(methyl methacrylate) (PMMA) or polystyrene (PS), a polymer derivative having a phenol group, an acryl-based polymer, an aryl ether-based polymer, an amide-based polymer, a fluorine-based polymer, a p-xylene based polymer, a vinyl alcohol-based polymer, and a blend thereof. In an exemplary embodiment, the first organic insulating layer 111 may include polyimide.

In an exemplary embodiment, the driving voltage line PL is covered by a second organic insulating layer 113. The second organic insulating layer 113 may include, for example, an imide-based polymer, a general-purpose polymer such as PMMA or PS, a polymer derivative having a phenol group, an acryl-based polymer, an aryl ether-based polymer, an amide-based polymer, a fluorine-based polymer, a p-xylene based polymer, a vinyl alcohol-based polymer, and a blend thereof. In an exemplary embodiment, the second organic insulating layer 113 may include polyimide.

A pixel electrode 210 is disposed on the second organic insulating layer 113. A pixel-defining layer 120 is disposed on the pixel electrode 210. The pixel-defining layer 120 may have an opening corresponding to each sub-pixel, that is, an opening exposing at least a central portion of the pixel electrode 210, and thus, may define a pixel. In addition, the pixel-defining layer 120 may increase a distance between an edge of the pixel electrode 210 and a common electrode 230, and thus, may prevent an arc, etc. from forming therebetween. The pixel-defining layer 120 may include an organic material such as, for example, polyimide or hexamethyldisiloxane (HMDSO).

An intermediate layer 220 may include a low molecular weight material or a polymer material. When the intermediate layer 220 includes a low molecular weight material, the intermediate layer 220 may have a structure in which a hole injection layer (HIL), a hole transport layer (HTL), an emission layer (EML), an electron transport layer (ETL), an electron injection layer (EIL), etc. are stacked in a single or complex structure, and may include various organic materials including, for example, copper phthalocyanine (CuPc), N,N'-Di(naphthalene-1-yl)-N,N'-diphenyl-benzidine (NPB), tris-8-hydroxyquinoline aluminum (Alq3), etc. Such layers may be formed, for example, by vacuum deposition.

When the intermediate layer 220 includes a polymer material, the intermediate layer 220 may generally have a structure including an HTL and an EML. In this regard, the HTL may include PEDOT, and the EML may include a polymer material such as, for example, a poly-phenylenevinylene (PPV)-based material, a polyfluorene-based material, etc. However, a structure of the intermediate layer 220 is not limited thereto. For example, according to exemplary embodiments, at least one of the layers constituting the intermediate layer 220 may be integrally formed over a plurality of pixel electrodes 210. Alternatively, according to exemplary embodiments, the intermediate layer 220 may include a layer patterned to correspond to each of a plurality of pixel electrodes 210.

The common electrode 230 may be disposed on the display area DA and may cover the display area DA. For example, the common electrode 230 may be integrally formed to cover a plurality of pixels.

Referring to the peripheral area PA of FIG. 3, a drive circuit, for example, the first scan drive circuit 20, is disposed on the substrate 100. The first scan drive circuit 20 may include thin film transistors TFT-P, and may include a wire connected to the thin film transistors TFT-P. The thin film transistors TFT-P may be formed by the same process as that used to form the thin film transistor TFT of the pixel circuit PC. The first scan drive circuit 20 includes an insulating layer 110 disposed between elements constituting the thin film transistors TFT-P (e.g., a semiconductor layer, a gate electrode, etc.). For example, at least one of the buffer layer 101, the gate insulating layer 103, and the first and second interlayer insulating layers 105 and 107 may extend to the peripheral area PA and constitute an insulating layer 110. The insulating layer 110 includes an inorganic insulation material.

In an exemplary embodiment, the first scan drive circuit 20 is covered by an inorganic insulating layer 109. The inorganic insulating layer 109 may prevent the connection wire 71 including a metal (e.g., aluminum), which may be damaged by an etchant, from being exposed to an etching environment in the manufacturing process of a display apparatus. FIG. 3 illustrates an example in which the inorganic insulating layer 109 is also disposed in the display area DA.

In an exemplary embodiment, the inorganic insulating layer 109 extends toward an edge 100E of the substrate 100. The inorganic insulating layer 109 may clad one end portion and the other end portion of the common power supply wire 70. Since one end portion and the other end portion of the common power supply wire 70 are covered by the inorganic insulating layer 109, the common power supply wire 70 may be prevented from lifting, and the end of the common power supply wire 70 may be prevented from being exposed to an etching environment in the manufacturing process. Thus, the inorganic insulating layer 109 may include a contact hole 109H via which the common power supply wire 70 is exposed.

The inorganic insulating layer 109 may include an inorganic material such as, for example, silicon oxide (SiOx), silicon nitride (SiNx) and/or silicon oxynitride (SiON), and may be a single layer or a multilayer. In exemplary embodiments, the inorganic insulating layer 109 may include silicon nitride (SiNx). The inorganic insulating layer 109 may have a thickness of about 500 Å to about 10,000 Å.

The first organic insulating layer 111 is disposed on the inorganic insulating layer 109. In the exemplary embodiment of FIG. 3, the first organic insulating layer 111 covers a drive circuit area DPC-A. However, exemplary embodiments of the present disclosure are not limited thereto. For example, in exemplary embodiments, the first organic insulating layer 111 does not cover the drive circuit area DPC-A. In an exemplary embodiment, an end portion 111E of the first organic insulating layer 111 clads one end portion of the common power supply wire 70.

In an exemplary embodiment, an auxiliary wire 72 is disposed on the common power supply wire 70. The auxiliary wire 72 may be electrically connected to and contact the common power supply wire 70 via the contact hole 109H of the inorganic insulating layer 109. The auxiliary wire 72 may include the same material as the driving voltage line PL of the pixel circuit PC.

The common power supply wire 70 is electrically connected to the common electrode 230 of the display element 200. In an exemplary embodiment, an end portion of the common electrode 230 extends over a dummy pixel area DPX of the peripheral area PA onto the first scan drive circuit 20, and directly contacts a conductive layer 75 in the same layer as the pixel electrode 210. In an exemplary embodiment, the conductive layer 75 extends to a wiring area PSW-A and directly contacts the auxiliary wire 72 located in the wiring area PSW-A, and is electrically connected to the common power supply wire 70 via the auxiliary wire 72.

The common power supply wire 70 may include the same material as the data line DL of the pixel circuit PC. The common power supply wire 70 may include the same material as the source electrode or the drain electrode of the thin film transistor TFT-P of the drive circuit area DPC-A.

In an exemplary embodiment, the common power supply wire 70 includes an alignment pattern AP, which may be patterned by removing a portion of the common power supply wire 70 to check the alignment of the substrate 100. The alignment pattern AP may function as an identification key for recognizing the alignment of the substrate 100 during a manufacturing process, and may have a size (or width) of at least about 100 μm to about 200 μm. When the alignment pattern AP has a size (or width) that is less than about 100 μm to about 200 μm, a recognition rate in equipment may be lowered. In an exemplary embodiment, the alignment pattern AP is formed by removing a portion of the common power supply wire 70. However, exemplary embodiments of the present disclosure are not limited thereto. For example, in exemplary embodiments, the alignment pattern AP may be formed through patterning as a separate layer on or under the common power supply wire 70.

The alignment pattern AP may be patterned by removing a portion of the common power supply wire 70, and a patterned portion may be provided with a hole 70H for forming the alignment pattern AP. The alignment pattern AP may expose at least a portion of the insulating layer 110 under the common power supply wire 70 via the hole 70H. The insulating layer 110 is a layer disposed under the common power supply wire 70, and may include the first interlayer insulating layer 105 and the second interlayer insulating layer 107. Referring to FIG. 3, in an exemplary embodiment, a portion of the second interlayer insulating layer 107 disposed under the common power supply wire 70 is exposed via the alignment pattern AP.

Figure 4A:
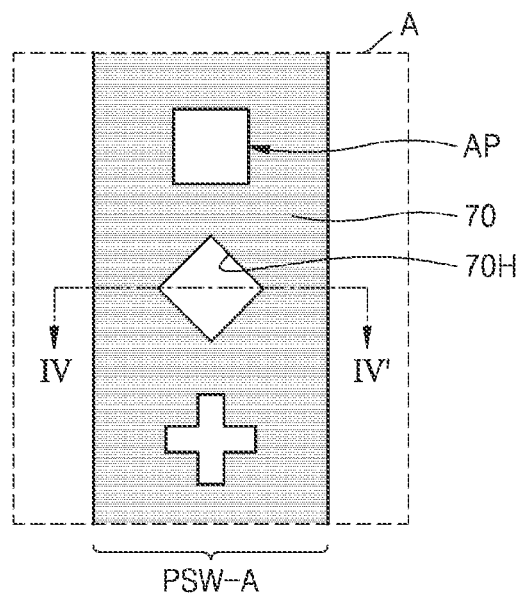
FIGS. 4A and 4B are a schematic plan view and a schematic cross-sectional view, respectively, of a display apparatus according to an exemplary embodiment of the present disclosure.
Figure 4B:
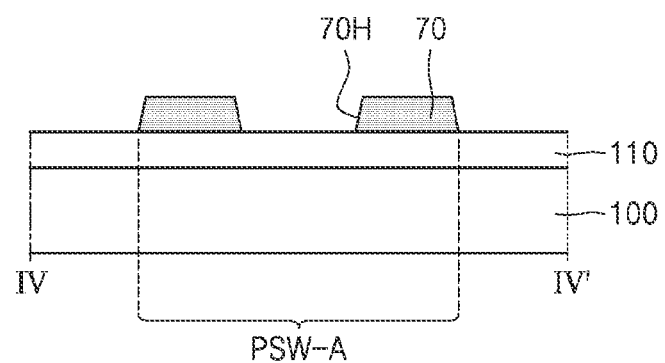
Figure 5A:
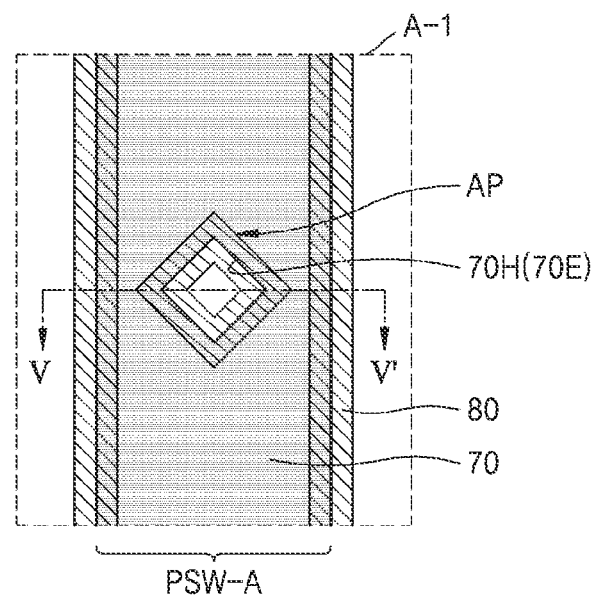
FIGS. 5A and 5B are a schematic plan view and a schematic cross-sectional view, respectively, of a display apparatus according to an exemplary embodiment of the present disclosure.
Figure 5B:
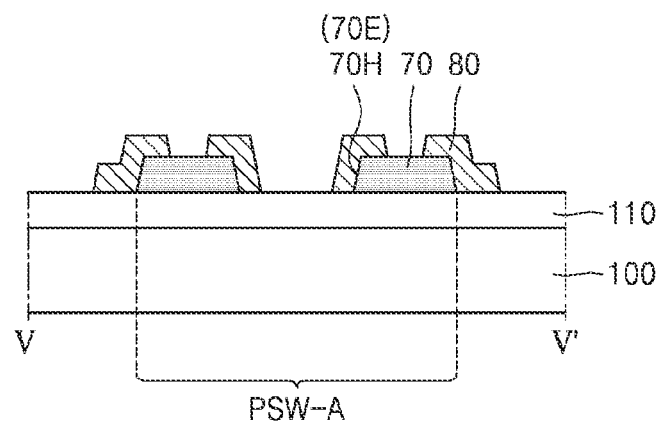
Figure 6A:
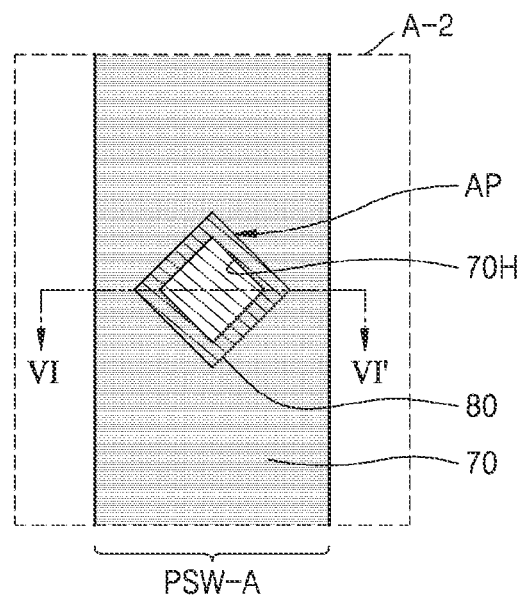
FIGS. 6A and 6B are a schematic plan view and a schematic cross-sectional view, respectively, of a display apparatus according to an exemplary embodiment of the present disclosure.
Figure 6B:
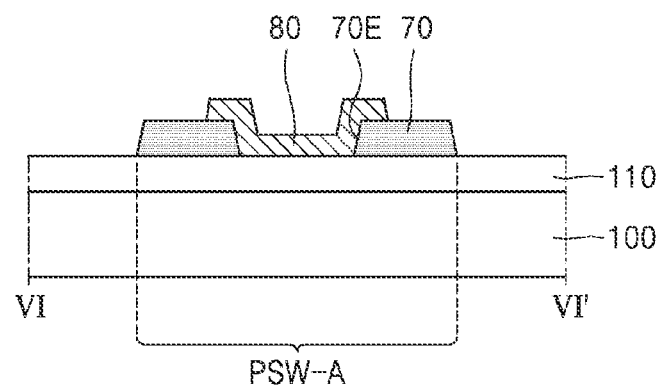

FIGS. 4A and 4B are respectively a schematic plan view and a schematic cross-sectional view of a display apparatus according to an exemplary embodiment of the present disclosure. FIG. 4B is a cross-sectional view taken along line IV-IV' of FIG. 4A. FIGS. 5A and 5B are respectively a schematic plan view and a schematic cross-sectional view of a display apparatus according to an exemplary embodiment of the present disclosure. FIG. 5B is a cross-sectional view taken along line V-V' of FIG. 5A. FIGS. 6A and 6B are respectively a schematic plan view and a schematic cross-sectional view of a display apparatus according to an exemplary embodiment of the present disclosure. FIG. 6B is a cross-sectional view taken along line IV-IV' of FIG. 6A.

FIGS. 4A and 4B illustrate various shapes of the alignment pattern AP according to exemplary embodiments of the present disclosure. FIG. 4A corresponds to area A illustrated in FIG. 3. Referring to FIG. 4A, the shape of the alignment pattern AP may be various polygonal shapes such as, for example, a square, a rhombus, and a cross. The alignment pattern AP may function as an identification key for aligning the alignment of the substrate 100. In an exemplary embodiment, the alignment pattern AP is formed in a recessed shape in which a portion of the common power supply wire 70 is removed. Thus, as shown in FIG. 4B, at least a portion of the insulating layer 110 under the common power supply wire 70 may be exposed via the alignment pattern AP.

Referring back to FIG. 3, in an exemplary embodiment, a cladding layer 80 covering a periphery of the alignment pattern AP is disposed on the alignment pattern AP. As described above, the alignment pattern AP may be formed in a recessed shape in which a portion of the common power supply wire 70 is removed. Thus, in an exemplary embodiment, the alignment pattern AP includes an inner surface 70E defining the shape of the alignment pattern AP. In an exemplary embodiment, the cladding layer 80 covers the inner surface 70E of the alignment pattern AP, and contacts at least a portion of the second interlayer insulating layer 107 exposed via the alignment pattern AP.

In an exemplary embodiment, the cladding layer 80 includes the same material as the inorganic insulating layer 109. However, exemplary embodiments of the present disclosure are not limited thereto. For example, in an exemplary embodiment, the cladding layer 80 may be formed as a separate layer and may include the same material as the other insulating layers disposed on the common power supply wire 70. The cladding layer 80 may prevent the shape of the alignment pattern AP from being damaged as the common power supply wire 70 is exposed to an etching environment in the manufacturing process.

Referring to FIGS. 5A and 5B, in an exemplary embodiment, the cladding layer 80 covers both the inner surface 70E forming the hole 70H of the alignment pattern AP and an end portion of the common power supply wire 70. In the exemplary embodiment of FIGS. 5A and 5B, the cladding layer 80 does not extend to the outside of the common power supply wire 70, and the cladding layer 80 covers an edge of the common power supply wire 70 and extends to the outside. FIG. 5A illustrates an area A-1, which corresponds to area A illustrated in FIG. 3 according to an exemplary embodiment of the present disclosure.

Referring to FIGS. 6A and 6B, in an exemplary embodiment, the cladding layer 80 is disposed on the alignment pattern AP and entirely covers the alignment pattern AP. For example, while the cladding layer 80 in the exemplary embodiment of FIGS. 3 and 5A covers the inner surface 70E of the alignment pattern AP and exposes at least a portion of the insulating layer 110, the cladding layer 80 in the exemplary embodiment of FIG. 6A entirely covers the alignment pattern AP. In an exemplary embodiment, the cladding layer 80 directly contacts the insulating layer 110 exposed by the alignment pattern AP. FIG. 6A illustrates an area A-2, which corresponds to area A illustrated in FIG. 3 according to an exemplary embodiment of the present disclosure.

In an exemplary embodiment, the cladding layer 80 entirely covers the common power supply wire 70 having the alignment pattern AP formed therein.

Figure 7A:
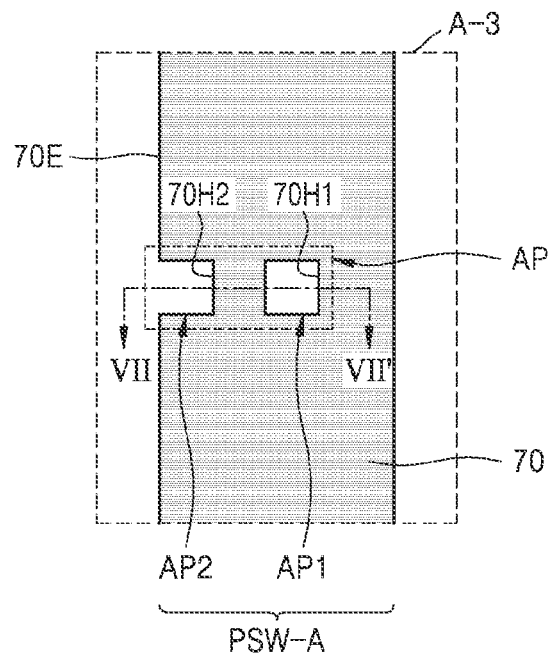
FIGS. 7A and 7B are a schematic plan view and a schematic cross-sectional view, respectively, of a display apparatus according to an exemplary embodiment of the present disclosure.
Figure 7B:
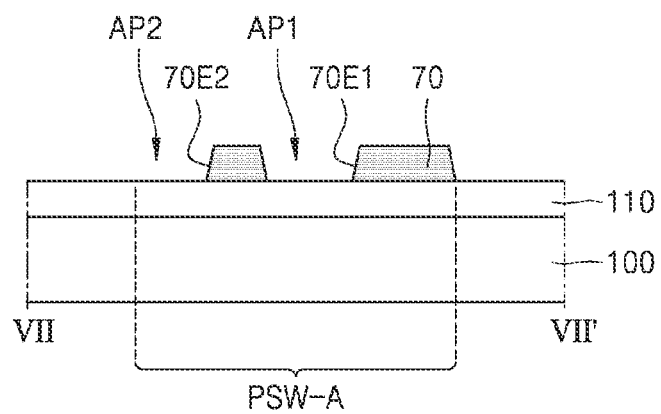
Figure 8:
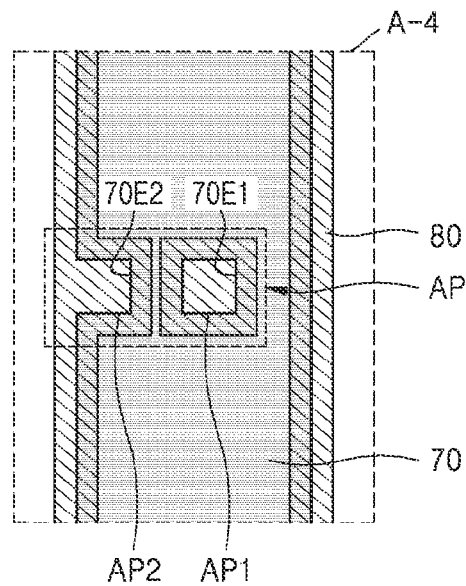
FIG. 8 is a schematic plan view of a display apparatus according to an exemplary embodiment of the present disclosure.
Figure 9:
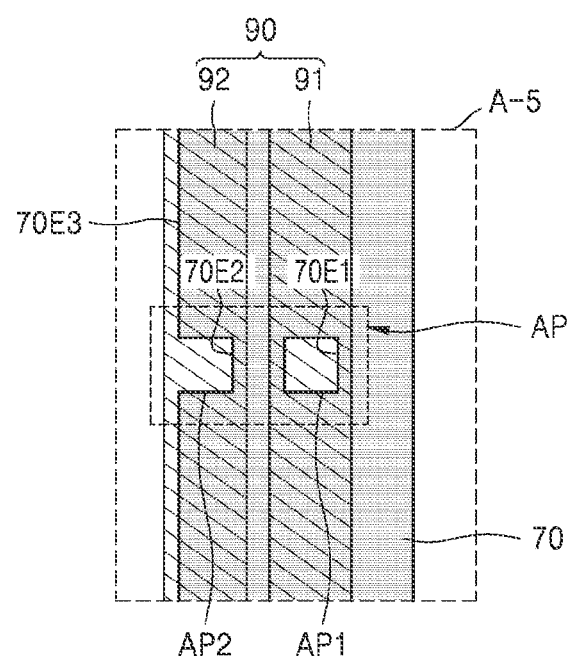
FIG. 9 is a schematic plan view of a display apparatus according to an exemplary embodiment of the present disclosure.

FIGS. 7A and 7B are a schematic plan view and a schematic cross-sectional view of a display apparatus according to an exemplary embodiment of the present disclosure. FIG. 7B is a cross-sectional view taken along line VII-VII' of FIG. 7A. FIG. 8 is a schematic plan view of a display apparatus according to an exemplary embodiment of the present disclosure. FIG. 9 is a schematic plan view of a display apparatus according to an exemplary embodiment of the present disclosure.

In the exemplary embodiments of FIGS. 7A to 9, an alignment pattern AP includes a first alignment pattern AP1 and a second alignment pattern AP2, which are spaced apart from each other by a certain interval and which form a pair. The first alignment pattern AP1 is located at the center of a common power supply wire 70, and the second alignment pattern AP2 is located over an edge of the common power supply wire 70.

Referring to FIGS. 7A and 7B, in an exemplary embodiment, a common power supply wire 70 has an alignment pattern AP patterned by removing at least a portion of the common power supply wire 70, as in the above-described exemplary embodiments. The alignment pattern AP includes a first alignment pattern AP1 and a second alignment pattern AP2, which together form a pair. FIG. 7A illustrates an area A-3, which corresponds to area A illustrated in FIG. 3 according to an exemplary embodiment of the present disclosure.

The alignment patterns AP are spaced apart by a certain interval, and the first alignment pattern AP1 and the second alignment pattern AP2 may be recognized as one pattern when a substrate 100 is aligned. As an edge area (i.e., non-display area) in the display apparatus gradually decreases, the width of a wire in the peripheral area PA becomes more narrow. In this case, when the alignment pattern AP has to have a certain size or width (e.g., between about 100 μm and about 200 μm), it may be difficult to form a pattern larger than a certain size in a narrow wire. Thus, when the alignment pattern AP is formed in the common power supply wire 70 as in exemplary embodiments of the present disclosure, the alignment pattern AP may be recognized as a pair, thereby increasing a recognition rate and reducing the edge area.

The first alignment pattern AP1 and the second alignment pattern AP2 in FIG. 7A are located on the same y-axis line. However, exemplary embodiments of the present disclosure are not limited thereto. For example, in an exemplary embodiment, the first alignment pattern AP1 and the second alignment pattern AP2 are located at different coordinates on the x-axis line and the y-axis line. If the alignment pattern AP has a size (or width) less than about 100 μm, a recognition rate in equipment may be degraded. In an exemplary embodiment, each of the first and second alignment patterns AP1 and AP2 has a size (or width) of about 30 μm to about 40 μm, and the first and second alignment patterns AP1 and AP2 are spaced apart by an interval of about 30 μm to about 40 μm. Thus, in an exemplary embodiment, the first alignment pattern AP1 and the second alignment pattern AP2 including the interval may be recognized as a size (or width) of about 100 μm.

The first alignment pattern AP1 and the second alignment pattern AP2 of FIG. 7A may also be patterned in a recessed shape by removing a portion of the common power supply wire 70. In an exemplary embodiment, at least a portion of the insulating layer 110 is exposed via the first alignment pattern AP1 and the second alignment pattern AP2.

The shapes of the first alignment pattern AP1 and the second alignment pattern AP2 may be defined as a first hole 70H1 and a second hole 70H2 provided in the common power supply wire 70, respectively. Referring to the plan view of FIG. 7A, the second hole 70H2 forming the second alignment pattern AP2 may be formed such that one side thereof is open to the periphery of the common power supply wire 70. For example, one side of the second alignment pattern AP2 is open toward an edge of the substrate 100. For example, the first alignment pattern AP1 may be located at the center of the common power supply wire 70, and the second alignment pattern AP2 may be located over an edge of the common power supply wire 70.

Referring to FIG. 8, in an exemplary embodiment, the cladding layer 80 is disposed on the first alignment pattern AP1 and the second alignment pattern AP2. The cladding layer 80 covers an edge of the common power supply wire 70 as well as the first alignment pattern AP1 and the second alignment pattern AP2. The cladding layer 80 contacts the insulating layer 110 exposed via the first alignment pattern AP1 and the second alignment pattern AP2. FIG. 8 illustrate an area A-4, which corresponds to area A illustrated in FIG. 3 according to an exemplary embodiment of the present disclosure.

Although FIG. 8 illustrates an example in which the cladding layer 80 covers the first alignment pattern AP1 and the second alignment pattern AP2, exemplary embodiments of the present disclosure are not limited thereto. For example, in an exemplary embodiment, the cladding layer 80 is integrally formed and extends to entirely cover the alignment pattern AP, and covers an edge of the common power supply wire 70. In an exemplary embodiment, the cladding layer 80 covers only inner surfaces 70E1 and 70E2 of the first alignment pattern AP1 and the second alignment pattern AP2. In an exemplary embodiment, the cladding layer 80 covers an end portion of the common power supply wire 70 and extends to the periphery of the common power supply wire 70.

Figure 10:
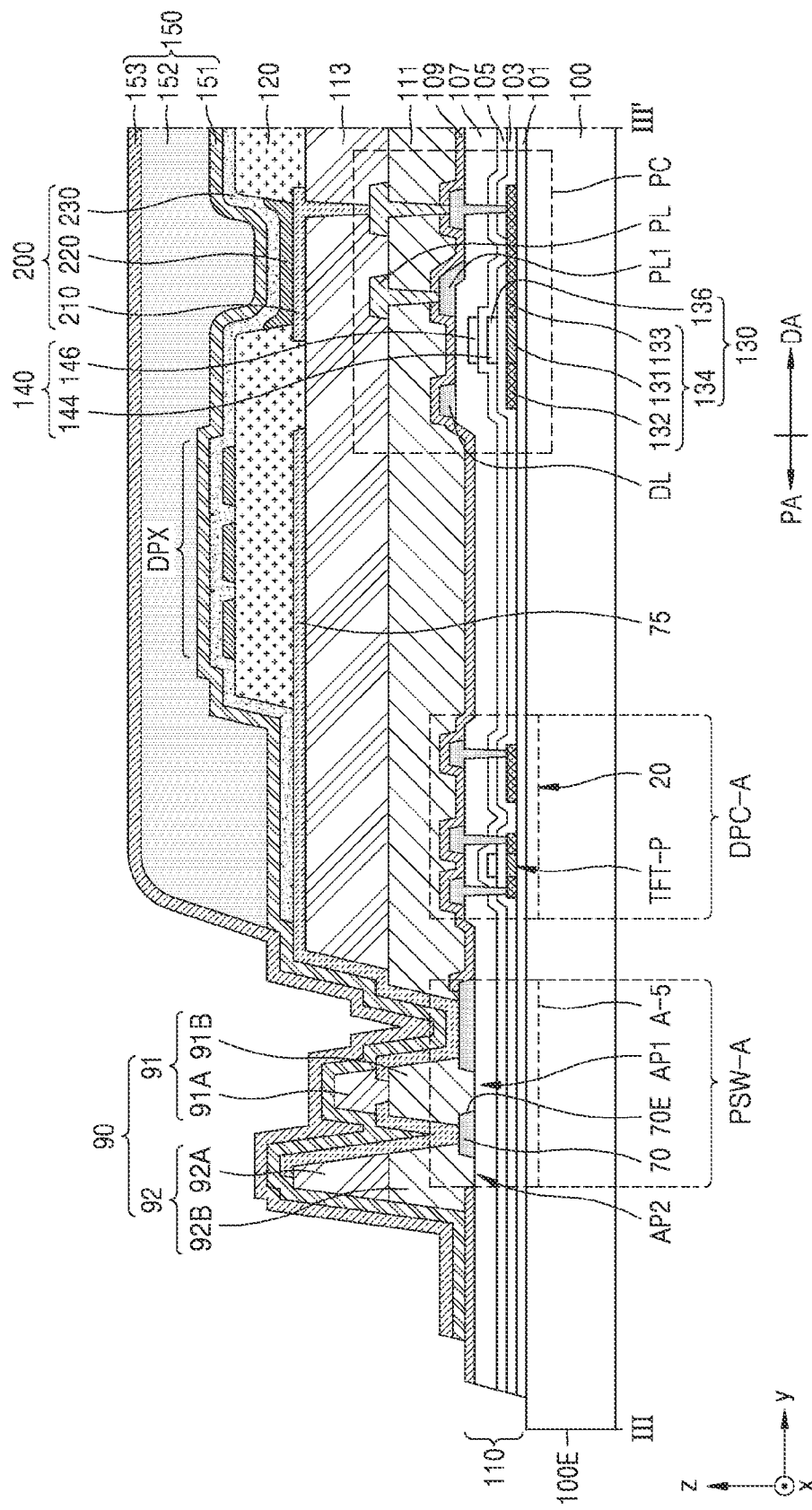
FIG. 10 is a schematic cross-sectional view of a display apparatus according to an exemplary embodiment of the present disclosure.

FIG. 10 is a schematic cross-sectional view of a display apparatus according to an exemplary embodiment of the present disclosure. FIG. 9 is a plan view corresponding to an area A-5 of FIG. 10.

The configuration of the display apparatus of FIG. 10 is similar to the configuration of the display apparatus of FIG. 3, except for the configuration related to the common power supply wire 70, which includes an alignment pattern AP, and a dam portion 90 located on the common power supply wire 70. Thus, for convenience of explanation, a further description of elements previously described will be omitted herein, and the description below will focus primarily on the differences between the display apparatus of FIG. 10 and the display apparatus of FIG. 3.

In an exemplary embodiment according to FIGS. 9 and 10 (see the area A-5), the dam portion 90 is located on the common power supply wire 70. The dam portion 90 includes a first dam portion 91 and a second dam portion 92 spaced apart from each other by a certain interval. The dam portion 90 may prevent the organic film 152 of the encapsulation portion 150 from overflowing toward the edge 100E of the substrate 100.

Referring to FIG. 9, in an exemplary embodiment, the dam portion 90 is disposed on the alignment pattern AP. For example, the first dam portion 91 may be located on the first alignment pattern AP1 and the second dam portion 92 may be located on the second alignment pattern AP2. Since the first dam portion 91 and the second dam portion 92 are located on the first alignment pattern AP1 and the second alignment pattern AP2, respectively, the first dam portion 91 and the second dam portion 92 may prevent the organic film 152 of the encapsulation portion 150 from overflowing, and may cover the first alignment pattern AP1 and the second alignment pattern AP2.

In an exemplary embodiment, the second dam portion 92 covers one end portion 70E3 of the common power supply wire 70 while covering the second alignment pattern AP2, as shown in FIG. 9. Although FIG. 9 illustrates an example in which the width of the first dam portion 91 is about equal to the width of the second dam portion 92, exemplary embodiments of the present disclosure are not limited thereto. For example, in an exemplary embodiment, the widths of the first dam portion 91 and the second dam portion 92 may be changed according to the sizes of the first alignment pattern AP1 and the second alignment pattern AP2 and/or the width of the common power supply wire 70. The first dam portion 91 and the second dam portion 92 may be variously modified. For example, the first dam portion 91 and the second dam portion 92 may be formed such that the widths thereof are relatively large in a region in which the first alignment pattern AP1 and the second alignment pattern AP2 are located, and are relatively small in a region in which the alignment pattern AP is not located.

FIG. 10 illustrates a partial cross-section of a display apparatus including the common power supply wire 70 in FIG. 9. The plane of the common power supply wire 70 in FIG. 10 may correspond to the structure shown in FIG. 9. For example, in an exemplary embodiment, the alignment pattern AP includes a first alignment pattern AP1 and a second alignment pattern AP2 spaced apart from each other by a certain interval. The first dam portion 91 is located on the first alignment pattern AP1, and the second dam portion 92 is located on the second alignment pattern AP2.

In an exemplary embodiment, the first dam portion 91 includes a first lower dam 91B and a first upper dam 91A, and the second dam portion 92 includes a second lower dam 92B and a second upper dam 92A. In an exemplary embodiment, the first and second lower dams 91B and 92B include the same material as the first organic insulating layer 111, and the first and second upper dams 91A and 92A include the same material as the second organic insulating layer 113. In an exemplary embodiment, a portion of a layer constituting the dam portion 90 includes the same material as the pixel-defining layer 120. In an exemplary embodiment, the first and second lower dams 91B and 92B include different materials, and the first and second upper dams 91A and 92A also include different materials.

In an exemplary embodiment, the first and second dams 91B and 92B cover the inner surface 70E of the alignment pattern AP. Thus, in an exemplary embodiment, the inner surface 70E of the alignment pattern AP and an end portion of the common power supply wire 70 are clad.

In an exemplary embodiment, the conductive layer 75 including the same material as the pixel electrode 210 in FIG. 10 extends to an upper portion of the second dam portion 92 and directly contacts at least a portion of the common power supply wire 70. The conductive layer 75 may contact the common electrode 230 and be electrically connected to the common electrode 230, and power supplied from the common power supply wire 70 may be applied to the common electrode 230 through the conductive layer 75. The first scan drive circuit 20 whose upper portion is covered by the conductive layer 75 may be protected from external static electricity.

Figure 11:
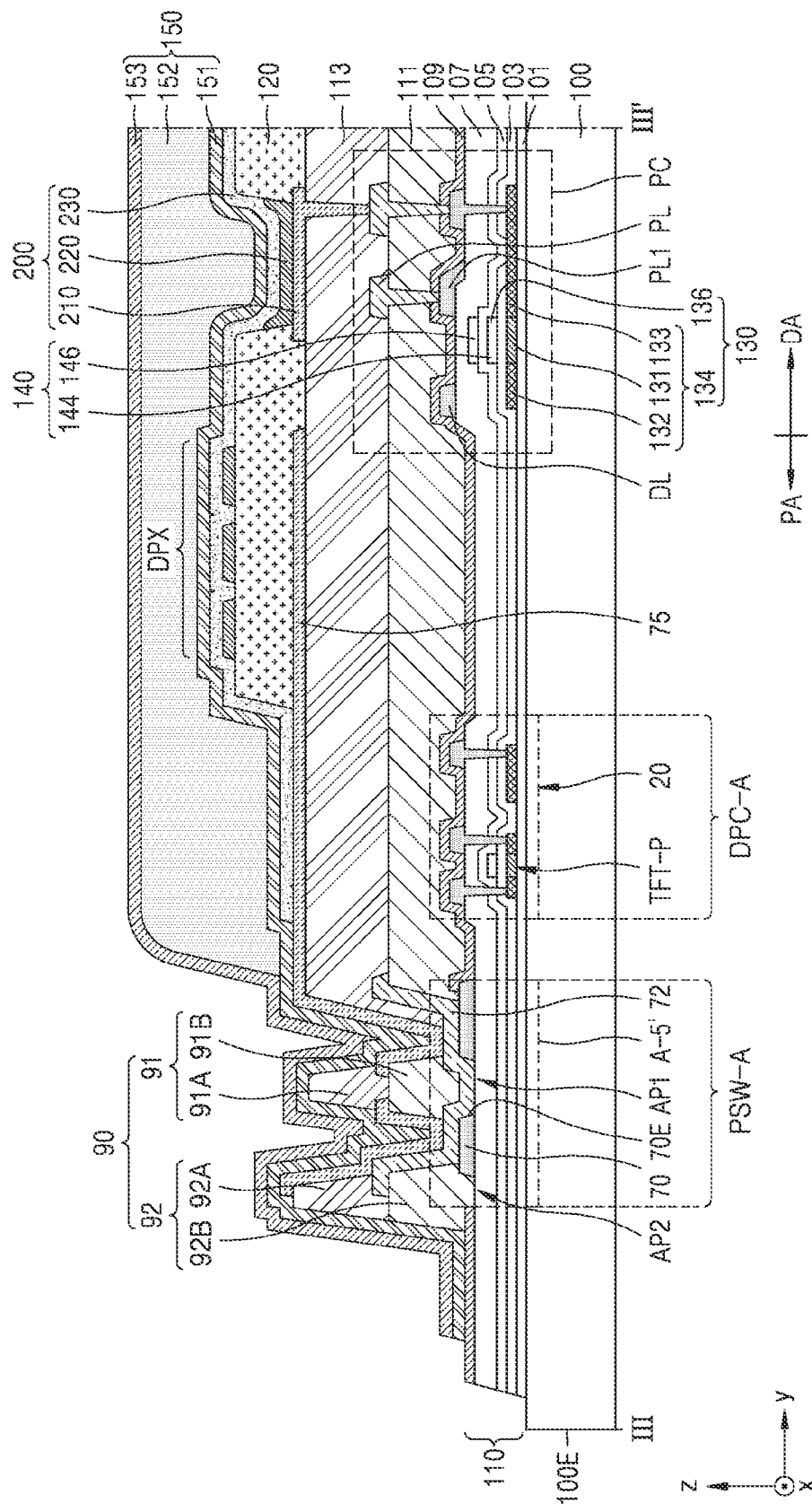
FIG. 11 is a schematic cross-sectional view of a display apparatus according to an exemplary embodiment of the present disclosure.

FIG. 11 is a schematic cross-sectional view of a display apparatus according to an exemplary embodiment of the present disclosure.

The configuration of the display apparatus of FIG. 11 is similar to the configuration of the display apparatus of FIGS. 3 and 10, except for the configuration related to the common power supply wire 70, which includes the alignment pattern AP, and the dam portion 90 located on the auxiliary wire 72 electrically connected to the common power supply wire 70. Thus, for convenience of explanation, a further description of elements previously described will be omitted herein, and the description below will focus primarily on the differences between the display apparatus of FIG. 11 and the display apparatus of FIGS. 3 and 10.

Referring to FIG. 11, in an exemplary embodiment, the auxiliary wire 72 is disposed on the common power supply wire 70. The auxiliary wire 72 is disposed between the common power supply wire 70 and the dam portion 90, and is electrically connected to the common power supply wire 70 via openings respectively formed in the inorganic insulating layer 109 and the first organic insulating layer 111. The auxiliary wiring 72 may include the same material as the driving voltage line PL of the pixel circuit PC. In FIG. 11, area A-5' corresponds to area A-5 illustrated in FIG. 10 according to an exemplary embodiment of the present disclosure.

Figure 12A:
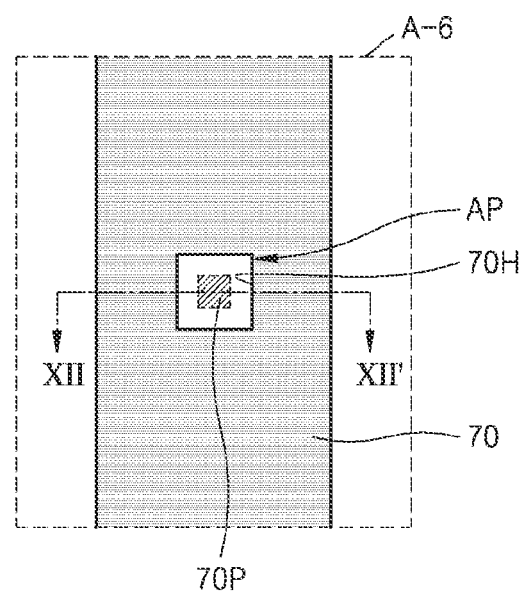
FIGS. 12A and 12B are a schematic plan view and a schematic cross-sectional view, respectively, of a display apparatus according to an exemplary embodiment of the present disclosure.
Figure 12B:
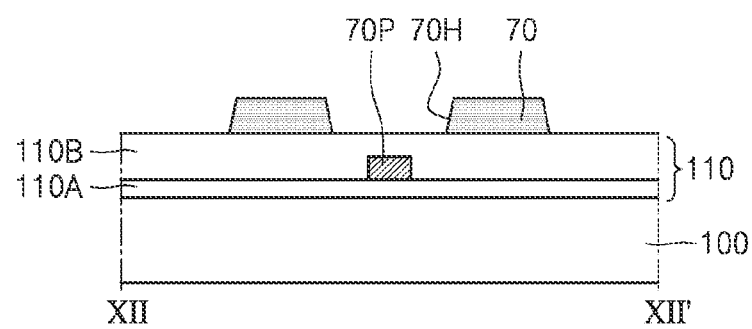
Figure 13:
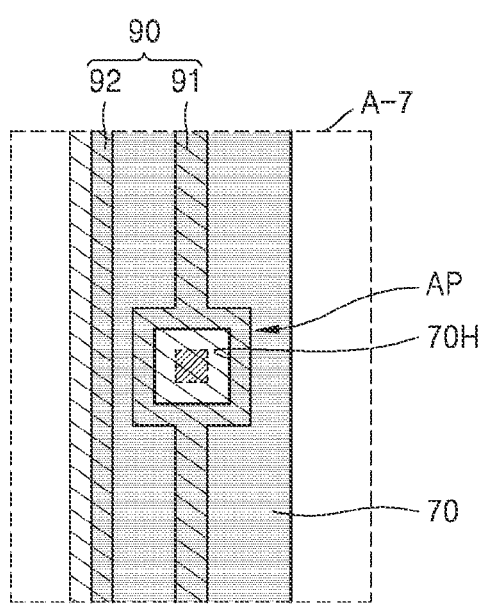
FIG. 13 is a schematic plan view of a display apparatus according to an exemplary embodiment of the present disclosure.

FIGS. 12A and 12B are a schematic plan view and a schematic cross-sectional view of a display apparatus according to an exemplary embodiment of the present disclosure. FIG. 12B is a cross-sectional view taken along line XII-XII' of FIG. 12A. FIG. 13 is a schematic plan view of a display apparatus according to an exemplary embodiment of the present disclosure.

Referring to FIGS. 12A, 12B and 13, in an exemplary embodiment, a display apparatus includes an auxiliary pattern layer 70P disposed under the common power supply wire 70 such that it overlaps the alignment pattern AP.

Referring to FIGS. 12A and 12B, in an exemplary embodiment, the auxiliary pattern layer 70P is disposed under the common power supply wire 70 and overlaps the alignment pattern AP. The auxiliary pattern layer 70P has a smaller size than the alignment pattern AP and is located inside the hole 70H in the auxiliary pattern layer 70P. A recognition rate of the alignment pattern AP may be increased through the auxiliary pattern layer 70P. FIG. 12A illustrates an area A-6, which corresponds to area A illustrated in FIG. 3 according to an exemplary embodiment of the present disclosure.

As shown in FIG. 12B, in an exemplary embodiment, an insulating layer 110 located under the common power supply wire 70 includes a first lower insulating layer 110A and a second lower insulating layer 110B positioned on the first lower insulating layer 110A. Referring to the cross-sectional view of FIG. 3, the first lower insulating layer 110A may be at least one of the buffer layer 101, the gate insulating layer 103, and the first interlayer insulating layer 105, and the second lower insulating layer 110B may be at least one of the gate insulating layer 103, the first interlayer insulating layer 105, and the second interlayer insulating layer 107.

In an exemplary embodiment, the auxiliary pattern layer 70P is located between the first lower insulating layer 110A and the second lower insulating layer 110B. For example, in an exemplary embodiment, the auxiliary pattern layer 70P is disposed on the first lower insulating layer 110A. In an exemplary embodiment, the auxiliary pattern layer 70P includes the same material as the gate electrode 136 of the thin film transistor 130. In this case, the auxiliary pattern layer 70P may be located on the gate insulating layer 103. In an exemplary embodiment, the auxiliary pattern layer 70P includes the same material as the second storage capacitor plate 146 of the storage capacitor 140. In this case, the auxiliary pattern layer 70P may be located on the first interlayer insulating layer 105.

The exemplary embodiment of FIG. 13 is substantially the same as the exemplary embodiment of FIG. 12, except that the dam portion 90 is located on the alignment pattern AP similar to the above-described exemplary embodiment of FIG. 9 (see the area A-5). Referring to FIGS. 10 and 13, in an exemplary embodiment, the first dam portion 91 is located on the alignment pattern AP and the second dam portion 92 is located on one end portion of the common power supply wire 70. In an exemplary embodiment, the cladding layer 80 as shown in FIG. 5A may be provided instead of the dam portion 90. FIG. 13 illustrates an area A-7, which corresponds to area A illustrated in FIG. 3 according to an exemplary embodiment of the present disclosure.

Figure 14:
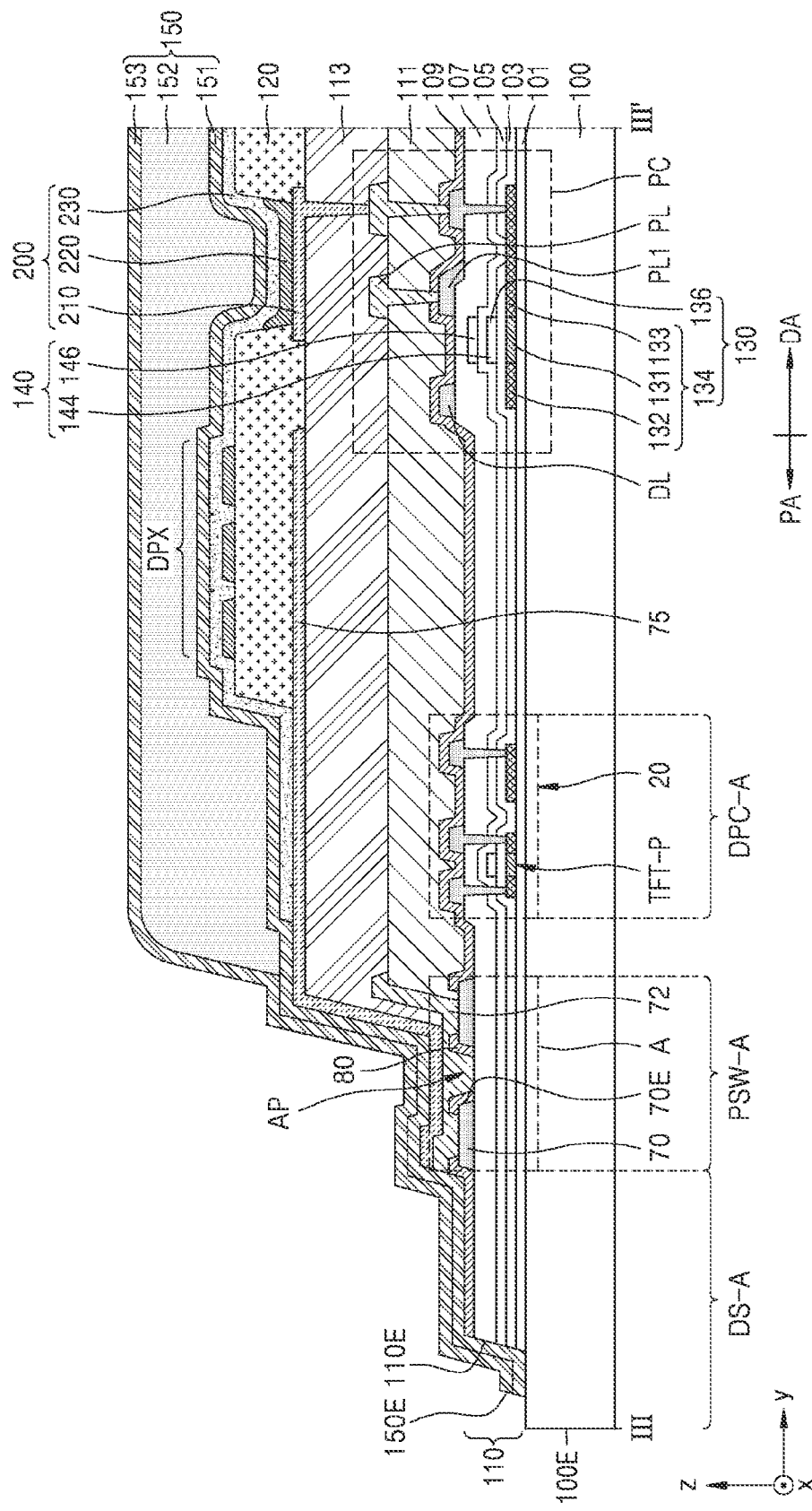
FIG. 14 is a schematic cross-sectional view of a display apparatus according to an exemplary embodiment of the present disclosure.
Figure 15:
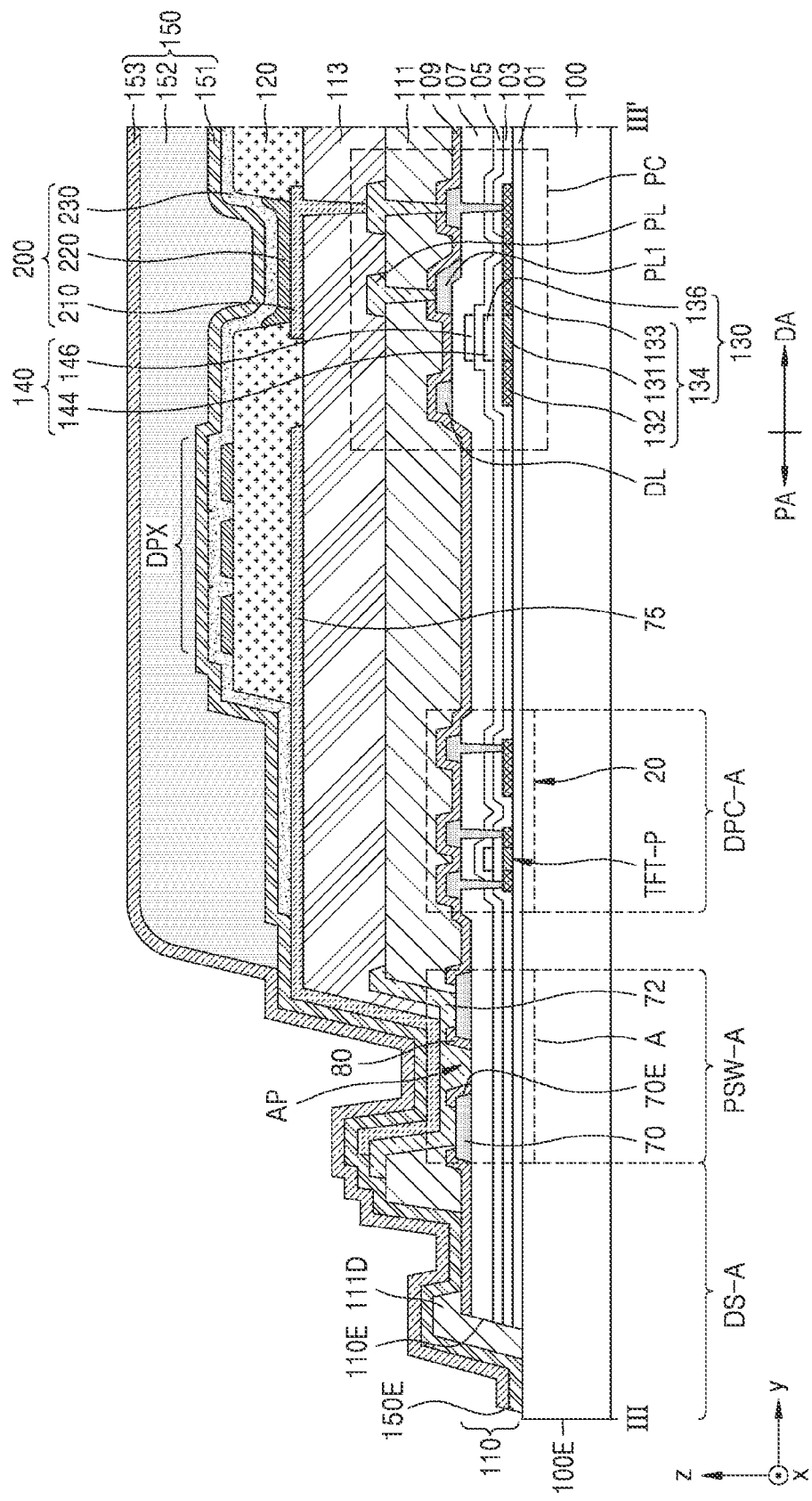
FIG. 15 is a schematic cross-sectional view of a display apparatus according to an exemplary embodiment of the present disclosure.

FIG. 14 is a schematic cross-sectional view of a display apparatus according to an exemplary embodiment of the present disclosure. FIG. 15 is a schematic cross-sectional view of a display apparatus according to an exemplary embodiment of the present disclosure.

The display apparatuses described with reference to FIGS. 14 and 15 differ from the display apparatus described with reference to FIG. 3 with relation to the encapsulation portion 150 and the configuration thereof. Thus, for convenience of explanation, a further description of the configuration of the display apparatus of FIG. 14, which is the same as that of the display apparatus described above with reference to FIG. 3, will be not repeatedly described, and the description below will focus primarily on the differences between the display apparatuses.

Referring to FIG. 14, in an exemplary embodiment, the insulating layer 110 is formed on the entire surface of the display area DA, and extends toward the edge 100E of the substrate 100 and is in the peripheral area PA. The insulating layer 110 further extends from the drive circuit area DPC-A and the wiring area PSW-A of the peripheral area PA to an edge area DS-A. The edge area DS-A is defined as an area located in the periphery of the wiring area PSW-A up to the edge 100E of the substrate 100.

In an exemplary embodiment, an end 150E of the encapsulation portion 150 extends toward the edge 100E of the substrate 100 and covers an end 110E of the insulating layer 110. The end 150E of the encapsulation portion 150 may refer to ends of the first inorganic film 151 and the second inorganic film 153. The end 150E of the encapsulation portion 150 may cover the end 110E of the insulating layer 110 and may directly contact the substrate 100.

FIG. 15 illustrates an exemplary embodiment of the present disclosure obtained by modifying the exemplary embodiment of FIG. 14. For example, compared to the exemplary embodiment of FIG. 14, the exemplary embodiment of FIG. 15 further includes an auxiliary dam portion 111D. The auxiliary dam portion 111D covers the end 110E of the insulating layer 110. The encapsulation portion 150 covers the auxiliary dam portion 111D covering the end 110E of the insulating layer 110, and extends to the edge 100E of the substrate 100. By covering the end 110E of the insulating layer 110 with the auxiliary dam portion 111D and the encapsulation portion 150, moisture permeation may be prevented more effectively. In exemplary embodiments, the auxiliary dam portion 111D is not included. When the auxiliary dam portion 111D is not included, the edge area DS-A of the display apparatus may be reduced by the area of the auxiliary dam portion 111D.

It is desirable to reduce the size of the edge area DS-A in next-generation display apparatuses. One reason that an edge area DS-A having a certain minimum width is retained in the periphery of the wiring area PSW-A in a display apparatus is to prevent moisture from flowing into the display apparatus from the edge 100E of the substrate 100. For example, in the display apparatus shown in FIG. 14, the end 150E of the encapsulation portion 150 covers the end 110E of the insulating layer 110, thereby effectively preventing moisture permeation into the inside of the display apparatus from the edge 100E of the substrate 100. When the end 150E of the encapsulation portion 150 covers the end 110E of the insulating layer 110 as described above, the width of the insulating layer 110 in the edge area DS-A may be further reduced, and thus, the width of the edge area DS-A may be effectively reduced.

According to exemplary embodiments of the present disclosure, a display apparatus having a reduced edge area is provided.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display device comprising:
    a substrate including a display area and a peripheral area surrounding the display area;
    a display element including a pixel electrode, an intermediate layer including an emission layer on the pixel electrode, and a common electrode on the intermediate layer;
    a common power supply wire disposed on the peripheral area and including a first conductive layer and a second conductive layer on the first conductive layer; and
    a third conductive layer disposed on the second conductive layer;
    wherein the common electrode is in electrical contact with the common power supply wire through the third conductive layer.

2. The display device of claim 1,
    wherein the first conductive layer and the second conductive layer are electrically connected to each other through a contact opening in an insulating layer.

3. The display device of claim 2,
    wherein the insulating layer comprises an inorganic insulating material.

4. The display device of claim 2, further comprising:
a thin film transistor disposed on the substrate and electrically connected to the display element,
wherein the insulating layer is disposed to cover the thin film transistor.

5. The display device of claim 4,
wherein the thin film transistor includes a semiconductor layer, a gate electrode, and an electrode layer connected to the semiconductor layer,
wherein the insulating layer is in contact with the electrode layer.

6. The display device of claim 5, further comprising:
an organic insulating layer disposed on the insulating layer,
wherein the organic insulating layer covers at least a portion of the second conductive layer.

7. The display device of claim 6,
wherein the third conductive layer on the organic insulating layer,
wherein the third conductive layer is electrically connected to the common power supply wire via a side surface of the organic insulating layer.

8. The display device of claim 7,
wherein the third conductive layer includes the same material as a pixel electrode in the display area.

9. The display device of claim 7, further comprising:
an organic pattern layer disposed on the third conductive layer on the common power supply wire.

10. The display device of claim 9, further comprising:
a pixel defining layer having an opening exposing a central portion of a pixel electrode in the display area,
wherein the organic pattern layer includes the same material as the pixel defining layer.

11. The display device of claim 5,
wherein the first conductive layer includes the same material as the electrode layer.

12. The display device of claim 1, further comprising:
an encapsulation layer disposed over the display area of the substrate and including a first inorganic encapsulation layer, a second inorganic encapsulation layer, and an organic encapsulation layer between the first inorganic encapsulation layer and the second inorganic encapsulation layer,
wherein the first inorganic encapsulation layer and the second inorganic encapsulation layer extend to the peripheral area, and are disposed over the second conductive layer.

13. A display device comprising:
a substrate including a display area and a peripheral area surrounding the display area;
a common power supply wire disposed on the peripheral area and including a first conductive layer and a second conductive layer on the first conductive layer;
a display element disposed on the display area and including a pixel electrode, an intermediate layer including an emission layer on the pixel electrode, and a common electrode on the intermediate layer;
a thin film transistor disposed on the display area and electrically connected to the display element via an electrode layer; and
a third conductive layer on a first insulating layer, the third conductive layer being electrically connected to the common power supply wire and the common electrode,
wherein at least one of the first conductive layer and the second conductive layer includes a same material as the electrode layer.

14. The display device of claim 13,
wherein the third conductive layer includes a same material as the pixel electrode.

15. The display device of claim 13,
wherein the first conductive layer and the second conductive layer are electrically connected to each other through a contact opening in a second insulating layer.

16. The display device of claim 13,
wherein the electrode layer includes a first electrode layer and a second electrode layer disposed on the first electrode layer, the first electrode layer including a same material as the first conductive layer and disposed on a same layer as the first conductive layer.

17. The display device of claim 16,
wherein the second electrode layer includes a same material as the second conductive layer and is disposed on a same layer as the second conductive layer.

18. The display device of claim 13, further comprising:
an organic pattern layer disposed on the third conductive layer on the common power supply wire.

19. The display device of claim 13, further comprising:
an encapsulation layer disposed over the display area of the substrate and including a first inorganic encapsulation layer, a second inorganic encapsulation layer, and an organic encapsulation layer between the first inorganic encapsulation layer and the second inorganic encapsulation layer,
wherein the first inorganic encapsulation layer and the second inorganic encapsulation layer extend to the peripheral area, and are disposed over the second conductive layer.

* * * * *